(12) United States Patent
Luchsinger et al.

(10) Patent No.: US 11,940,481 B2
(45) Date of Patent: Mar. 26, 2024

(54) ELECTRICAL CONNECTION TEST FOR UNPOPULATED PRINTED CIRCUIT BOARDS

(71) Applicant: DYCONEX AG, Bassersdorf (CH)

(72) Inventors: Daniel Luchsinger, Bassersdorf (CH); Stephan Messerli, Schocherswill (CH); Sven Johannsen, Nuerensdorf (CH); Hans-Peter Klein, Saarbruecken (DE)

(73) Assignee: DYCONEX AG, Bassersdorf (CH)

( * ) Notice: Subject to any disclaimer, the term of this patent is extended or adjusted under 35 U.S.C. 154(b) by 2 days.

(21) Appl. No.: 17/636,637

(22) PCT Filed: Jul. 22, 2020

(86) PCT No.: PCT/EP2020/070639
§ 371 (c)(1),
(2) Date: Feb. 18, 2022

(87) PCT Pub. No.: WO2021/032396
PCT Pub. Date: Feb. 25, 2021

(65) Prior Publication Data
US 2022/0283218 A1    Sep. 8, 2022

(30) Foreign Application Priority Data
Aug. 19, 2019    (EP) .................................. 19192329

(51) Int. Cl.
*G01R 31/28*    (2006.01)
*H05K 3/34*    (2006.01)

(52) U.S. Cl.
CPC ..... *G01R 31/2805* (2013.01); *G01R 31/2808* (2013.01); *G01R 31/2817* (2013.01); *H05K 3/3494* (2013.01)

(58) Field of Classification Search
CPC .............. G01R 1/0408; G01R 31/2805; G01R 31/2808; G01R 31/2817; G01R 3/00;
(Continued)

(56) References Cited

U.S. PATENT DOCUMENTS 4,510,446 A * 4/1985 Braun ................. G01R 31/2805
324/763.01
5,172,063 A * 12/1992 Munikoti ............. G01R 31/281
324/763.01

(Continued)

FOREIGN PATENT DOCUMENTS

DE    102007007529 A1    8/2007
WO    2014207894 A1    12/2014

OTHER PUBLICATIONS

International Search Report (PCT/ISA/210) and Written Opinion (PCT/ISA/237) dated Sep. 4, 2020, by the European Patent Office as the International Searching Authority for International Application No. PCT/EP2020/070639.

*Primary Examiner* — Vinh P Nguyen
(74) *Attorney, Agent, or Firm* — Buchanan Ingersoll & Rooney PC

(57) ABSTRACT

Embodiments relate to a test method for testing an unpopulated printed circuit board. The method can involve the steps of: exposing the unpopulated printed circuit board to temperatures of a reflow soldering process in a first step; and testing the electrical connections of the unpopulated printed circuit board. Embodiments also relate to a test device and a method for producing populated printed circuit boards.

14 Claims, 6 Drawing Sheets

(58) Field of Classification Search
CPC ...... G01R 31/28; G01R 31/309; G01R 31/71;
G01R 31/2813; G01R 31/2801; G01R
31/54; G01R 31/304; G01R 31/2874;
G01R 31/281; G01R 31/2853; G01R
31/2875; G01R 31/3193; G01R 31/66;
H05K 3/3494; H05K 1/0268; H05K 3/34;
H05K 3/3452; H05K 3/46; H05K
2203/163; H05K 1/0269; H05K 13/0817;
H05K 1/115; H05K 2203/043; H05K
13/08; H05K 13/083; H05K 1/18; H05K
2203/1105; H05K 2203/162; H05K
2203/1572; H05K 3/4614; H05K 1/0203;
H05K 1/165; H05K 7/209; H05K
2201/06

See application file for complete search history.

(56) References Cited

U.S. PATENT DOCUMENTS

| | | | | |
|---|---|---|---|---|
| 5,198,756 | A * | 3/1993 | Jenkins | G01R 1/073 |
| | | | | 324/763.01 |
| 6,521,841 | B2 * | 2/2003 | Kawaguchi | G01R 31/2818 |
| | | | | 174/250 |
| 7,129,732 | B1 * | 10/2006 | Knadle | G01R 31/2817 |
| | | | | 361/796 |
| 7,317,621 | B2 * | 1/2008 | Kimura | H05K 1/165 |
| | | | | 257/E25.031 |
| 8,371,027 | B2 * | 2/2013 | Inoue | H05K 13/0812 |
| | | | | 29/721 |
| 10,656,619 | B2 * | 5/2020 | Furuichi | H05K 13/0815 |
| 10,779,451 | B2 * | 9/2020 | Knox | B33Y 10/00 |
| 2015/0129575 | A1 | 5/2015 | Tanaka | |

\* cited by examiner

ELECTRICAL CONNECTION TEST FOR UNPOPULATED PRINTED CIRCUIT BOARDS

CROSS-REFERENCE TO RELATED APPLICATIONS

This application is the United States National Phase under 35 U.S.C. § 371 of PCT International Patent Application No. PCT/EP2020/070639, filed on Jul. 22, 2020, which claims the benefit of European Patent Application No. 19192329.1, filed on Aug. 19, 2019, the disclosures of which are hereby incorporated by reference herein in their entireties.

TECHNICAL FIELD

The present invention relates to a test method and a test device for unpopulated printed circuit boards and to a method for producing printed circuit boards.

BACKGROUND

Printed circuit boards for electronic devices are typically tested for functional and structural integrity in the unpopulated state. These tests may include, for example, optical inspection, etc. A fundamental test, however, is the detection of electrically interrupted or short-circuited connections, for example in vias or conductor tracks on the printed circuit board. These tests are usually performed at room temperature.

It is problematic, however, that electrically unsafe connections might only occur later, for example after electronic components have been populated or wired on the printed circuit board.

The present disclosure is directed toward overcoming one or more of the above-mentioned problems, though not necessarily limited to embodiments that do.

SUMMARY

It is therefore an objective of the present invention to provide methods and means by which electrically unsafe connections may be reliably found.

At least this objective is achieved by a test method having the features of claim 1 and by a test device having the features of claim 8. Appropriate embodiments are described in the corresponding dependent claims and in the following description.

According to claim 1, a test method for unpopulated printed circuit boards is provided. The test method comprises the steps of:
a) exposing the unpopulated printed circuit board to temperatures of a reflow soldering process; and
b) testing the electrical connections of the unpopulated printed circuit board.

Within the context of the present invention, the term "reflow soldering process" is used in the sense that is understandable and customary for a skilled person. In particular, it denotes a soft soldering process commonly used in electrical engineering for soldering SMD (surface mounted device) components, wherein a soft solder, in particular a soft solder paste, is applied to an unpopulated printed circuit board, the printed circuit board is then populated with one or more electronic components, and the printed circuit board thus populated is then heated.

According to an embodiment of the method according to the present invention, step a) is carried out at a temperature in the range of 150° C. to 250° C., particularly at a temperature in the range of 200° C. and 250° C., preferably at a temperature of approximately 210°.

According to a further embodiment of the method according to the present invention, step b) is carried out at a temperature in the range of from 100° C. to 120° C., in particular at approximately 110° C.

According to a further embodiment of the method according to the present invention, step a) is carried out by means of a first heating plate and a second heating plate, the unpopulated printed circuit board being arranged between the first heating plate and the second heating plate.

According to a further embodiment of the method according to the present invention, the first heating plate, the unpopulated printed circuit board and the second heating plate are surrounded by a first frame plate and a second frame plate.

In particular, it is provided that the first heating plate and the second heating plate or the first frame plate and the second frame plate are held together by a magnetic element. Additionally or alternatively, the first heating plate and the first frame plate and/or the second heating plate and the second frame plate may also be laminated together.

According to a further embodiment of the method according to the present invention, the first heating plate and/or the second heating plate comprise a heating conductor. Preferably, the heating conductor has a meandering shape.

According to a further embodiment of the method according to the present invention, the first heating plate and/or the second heating plate consists of or comprises a plastics material, for example a glass-fibre-reinforced plastics material such as epoxy. Preferably, the first heating plate and/or the second heating plate is configured with multiple layers.

According to a further embodiment of the method according to the present invention, the first frame plate and/or the second frame plate consists of or comprises metal, such as steel or aluminium.

According to a further embodiment of the method according to the present invention, the first heating plate and/or the second heating plate has a coating made of copper, which may preferably also comprise a gold coating. Advantageously, this may prevent the structure of the heating plate from being transferred to the unpopulated printed circuit board to be tested. At the same time, the copper layer acts advantageously as a heat distributor (diffuser).

According to a further embodiment of the method according to the present invention, the first frame plate and/or the second frame plate is manufactured from a copper-free printed circuit board material.

According to a further embodiment of the method according to the present invention, the first heating plate and/or the second heating plate and/or the first frame plate and/or the second frame plate has multiple openings. It is advantageous that the unpopulated printed circuit board is arranged between the heating plates or the heating plates and the frame plates in such a way that vias and/or conductor tracks of the printed circuit boards may be reached from outside through the openings.

According to a further embodiment of the method according to the present invention, the testing of the electrical connections includes a continuity test and an insulation test.

Such a continuity test comprises, in particular, a testing of the electrical connections between test points in a network, wherein it is ensured that each test point is electrically connected every other test point. The electrical connections between all test points may be measured directly, for example by measuring the resistance, or indirectly by determining the electrical properties (capacitance, resistance, etc.) of the unpopulated printed circuit board being tested and comparing them with reference values.

An insulation test comprises, in particular, a testing of the electrical insulation between test points of a network. The insulation may be measured directly via the resistance or indirectly by determining the electrical properties (capacitance, resistance, etc.) of the unpopulated printed circuit board being tested and comparing them with reference values.

According to claim 8, a test device is provided for performing a functional test of an unpopulated printed circuit board. The test device comprises:
- a first heating plate and a second heating plate, the first heating plate and the second heating plate being designed to receive an unpopulated printed circuit board, and
- a first frame plate and a second frame plate, the first frame plate and the second frame plate being designed to receive the first heating plate and the second heating plate.

In particular, the test device according to the present invention is designed to carry out the test method according to the present invention.

Furthermore, the test device according to the present invention, in particular, may be arranged in or on a device for performing a continuity test and/or insulation test.

Such a device for performing a continuity test and/or insulation test comprises, in particular, receiving devices for receiving the unpopulated printed circuit board to be tested, as well as one or more contact pins or contact needles for electrically contacting electrical contacts.

The device may also be designed for automatic testing. A non-limiting example of such a fixture is an automatic tester from MicroCraft, Japan, such as the E4H6151L model.

According to an embodiment of the test device according to the present invention, the first heating plate and/or the second heating plate comprises a heat conductor. The heat conductor preferably has a meandering shape.

According to a further embodiment of the test device according to the present invention, the first heating plate and/or the second heating plate consists of or comprises a plastics material, for example a glass-fibre-reinforced plastics material such as epoxy.

According to a further embodiment of the test device according to the present invention, the first heating plate and/or the second heating plate comprise a coating made of copper, wherein in particular the copper coating may comprise a gold coating.

According to a further embodiment of the test device according to the present invention, the first heating plate and/or the second heating plate comprise a thermocouple, the thermocouple being designed or configured to determine the temperature in the heating plate.

According to a further embodiment of the test device according to the present invention, the first heating plate and/or the second heating plate have one or more alignment points for the unpopulated printed circuit board.

According to a further embodiment of the test device according to the present invention, the first heating plate and/or the second heating plate is configured with multiple layers.

According to a further embodiment of the test device according to the present invention, the first frame plate and/or the second frame plate is manufactured from a copper-free printed circuit board material.

According to a further embodiment of the test device according to the present invention, the first heating plate and/or the second heating plate and/or the first frame plate and/or the second frame plate comprises multiple openings.

According to a further embodiment, the test device according to the present invention further comprises at least one magnetic element, which is designed or configured to hold the first heating plate and the second heating plate or the first frame plate and the second frame plate together. Preferably, the magnetic element is heat-resistant, for example resistant to temperatures in the range of from 150° C. to 250° C.

According to an embodiment of the test device according to the present invention, the first heating plate and the first frame plate and/or the second heating plate and the second frame plate are laminated together.

According to claim 15, a method for producing a populated printed circuit board is provided. The method comprises the steps of:
- providing a multiplicity of unpopulated printed circuit boards,
- testing the multiplicity of unpopulated printed circuit boards using the test method according to the present invention,
- selecting an unpopulated printed circuit board having intact electrical connections from the multiplicity of tested unpopulated printed circuit boards,
- populating the selected unpopulated printed circuit board having intact electrical connections with one or more electronic components, and performing a reflow step with the populated printed circuit board.

According to an embodiment of the production method according to the present invention, it is provided that the reflow steps are performed at a temperature in the range of from 150° C. to 250° C., particularly at a temperature in range of 200° C. to 250° C. preferably at a temperature of about 210° C.

Additional features, aspects, objects, advantages, and possible applications of the present disclosure will become apparent from a study of the exemplary embodiments and examples described below, in combination with the Figures and the appended claims.

BRIEF DESCRIPTION OF THE DRAWINGS

Further features and advantages of the present invention will be explained below on the basis of the description of figures showing embodiments, in which.

DETAILED DESCRIPTION

A normal test of an unpopulated printed circuit board usually consists of what is known as the continuity test and the insulation test. To find vias where the ground connection is broken by increased temperature, for example soldering, the following test according to the present invention is proposed.

In the test according to the present invention, a full-surface heating plate (bulk) is used to check the integrity of the conductor tracks and vias using a horizontal electrical needle tester for unpopulated printed circuit boards 1. However, the full-surface heating plate limits the test to one side. In order to achieve the greatest possible coverage of the networks of the unpopulated printed circuit board, the test is performed in two runs from one side each: once from the top side and once from the bottom side. The disadvantage of the single-sided test performed twice is that it is not possible to test networks that are connected from the top side to the bottom side.

In a further development of the inventive concept, the principle described below is therefore proposed. With the new principle, the additional electrical continuity test is performed on the product at elevated temperature from the top side and bottom side simultaneously, as in a normal electrical test.

Figure 2:
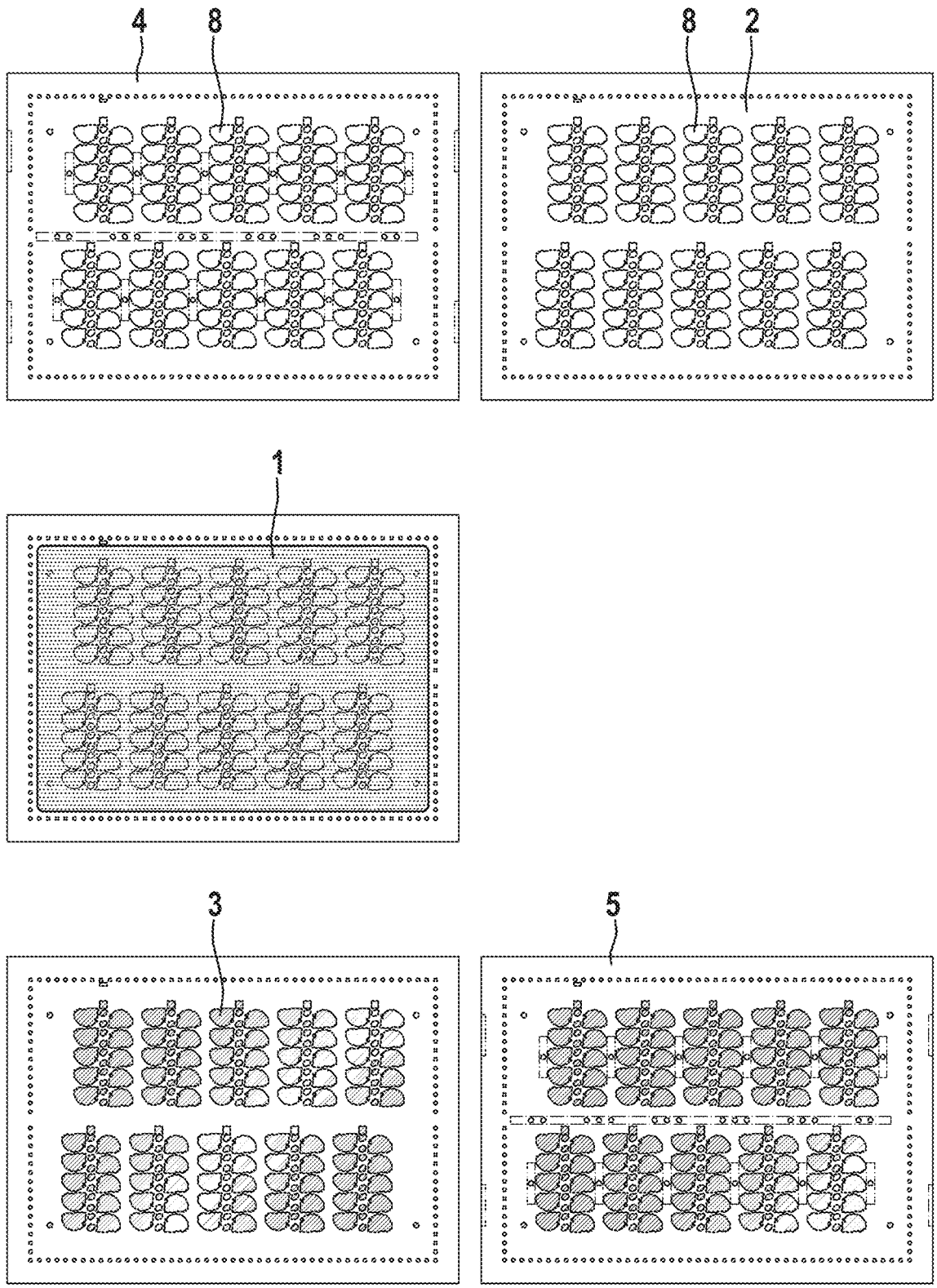
FIG. 2 shows in detail the individual components of the embodiment shown in FIG. 1.

The unpopulated printed circuit board 1 is packed between two heating plates 2, 3 (sandwich principle); these are heated, and the two electrical tests—as mentioned at the outset—are performed. To ensure that the electrical tests may be performed particularly efficiently, it is advantageous to adapt the heating plates, which are constructed in a mirrored fashion on two sides, to each product (as shown in FIG. 2, for example).

Figure 1:
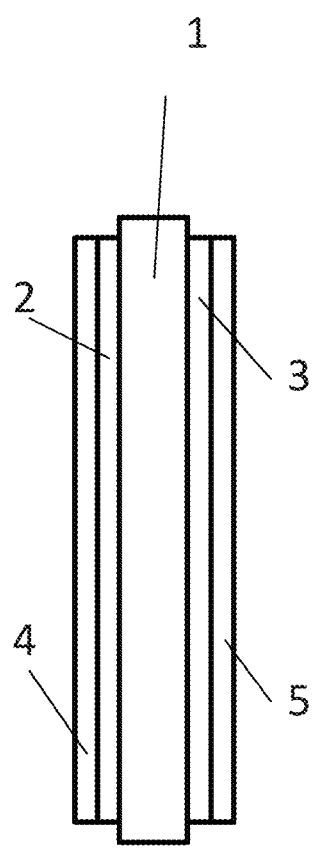
FIG. 1 schematically shows an embodiment of the test device according to the present invention.
Figure 5:
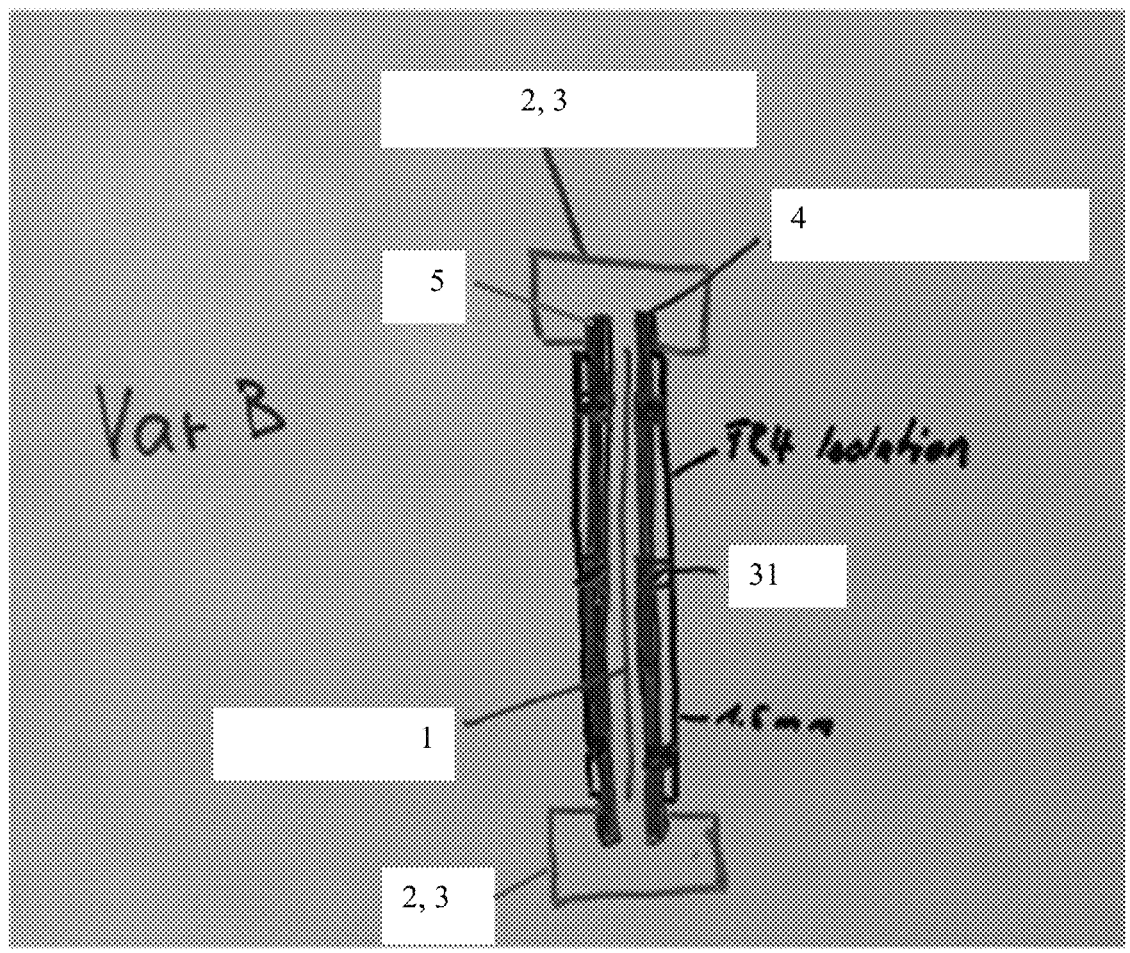
FIG. 5 schematically shows an embodiment of the test device illustrating magnetic elements.

The sandwich structure described above is constructed as shown in FIG. 1 and comprises two heating plates 2, 3, which surround the printed circuit board 1 to be tested. The heating plates 2, 3 are surrounded, in turn, by two frame plates 4, 5, which give stability to the sandwich structure. The sandwich structure is preferably held together using high-temperature-resistant magnets 31. Each frame plate 4, 5 includes multiple openings 8. As shown in FIG. 5, in some embodiments, one or more magnetic elements 31 configured to hold the first heating plate 2 and the second heating plate 3 or the first frame plate 4 and the second frame plate 5 together.

Figure 3A:
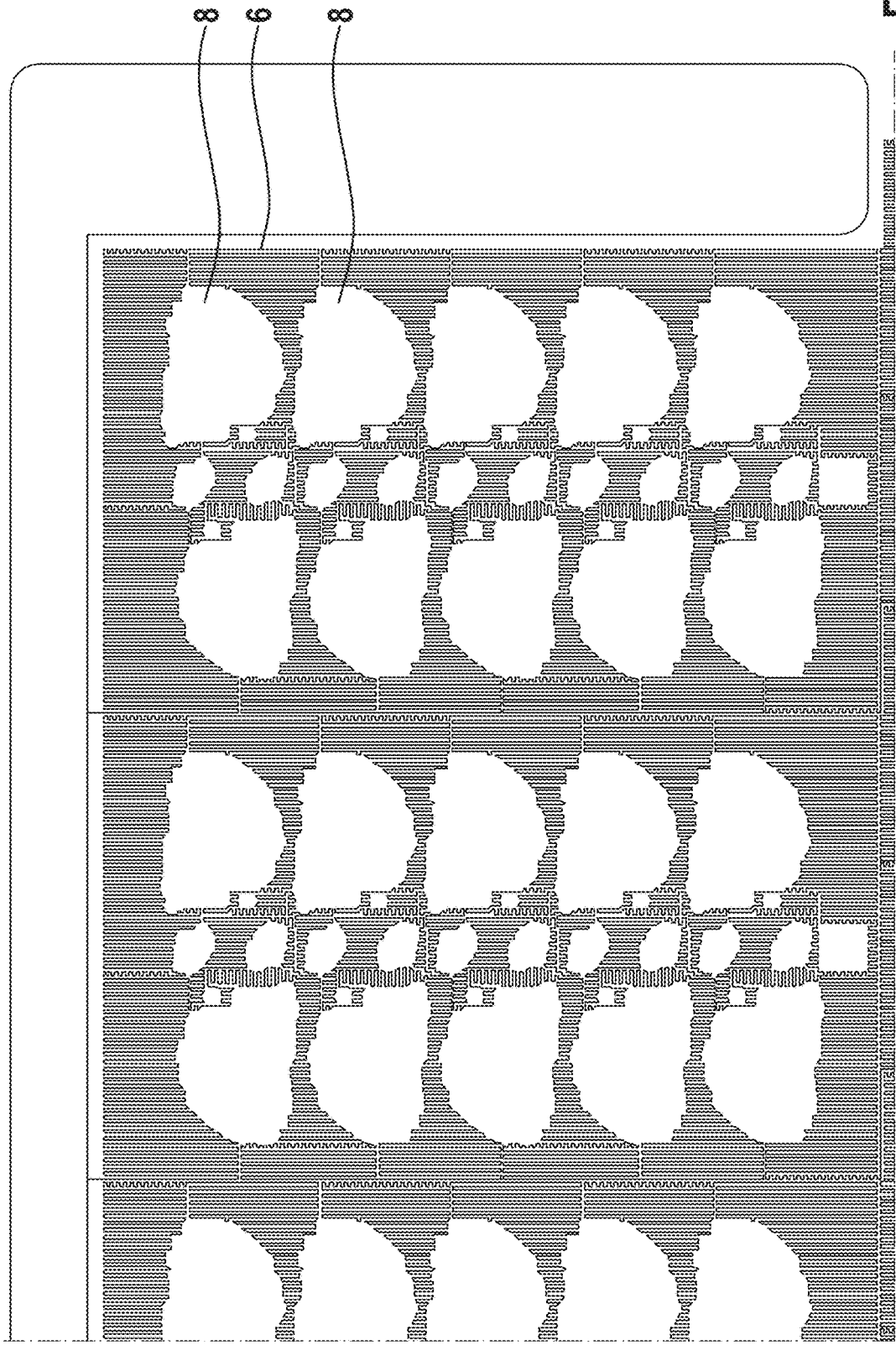
FIGS. 3A-3B show detailed views of a single component (heating plate) of the embodiment shown in FIG. 1.
Figure 3B:
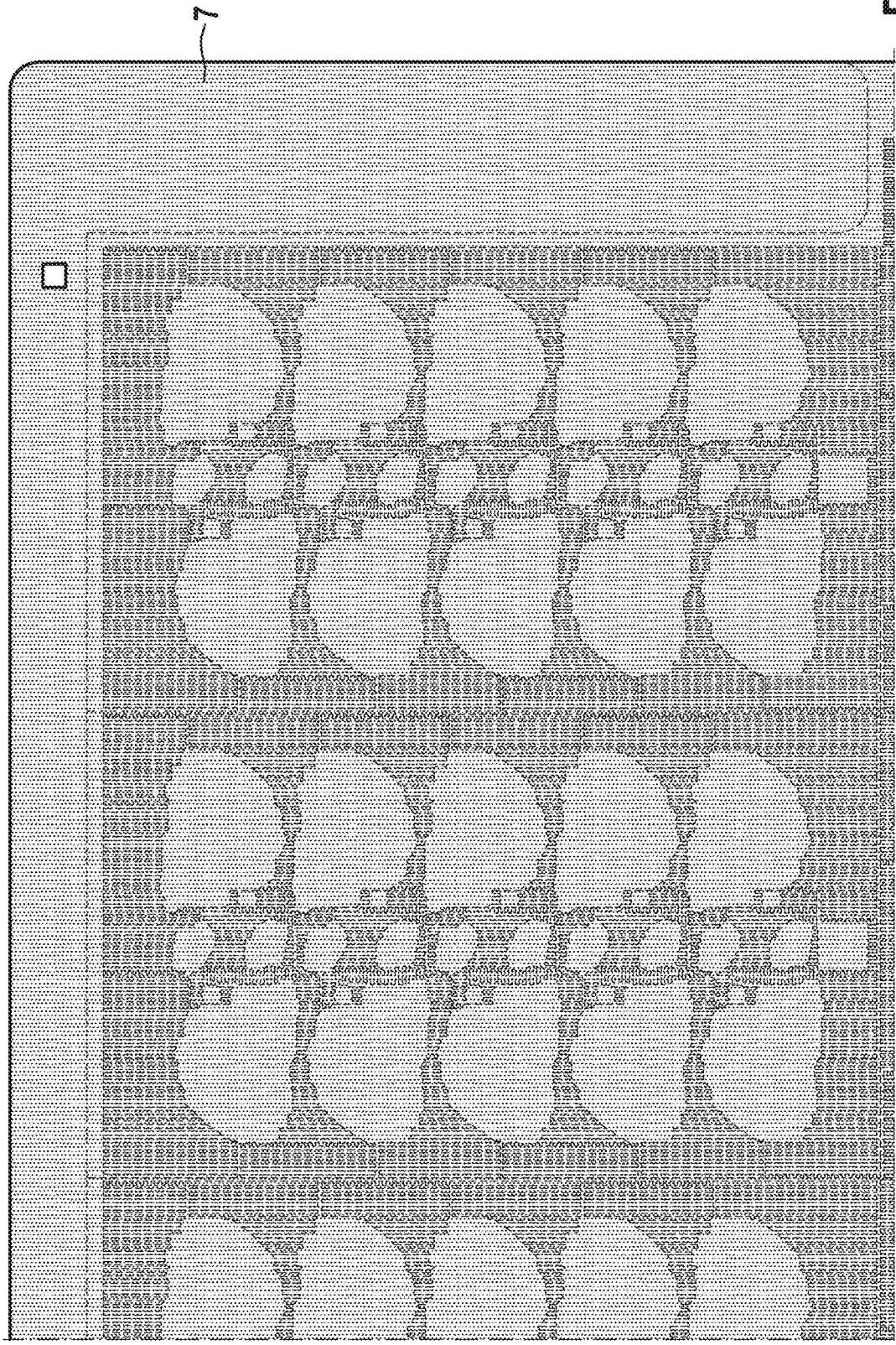

The actual heating plate 2, 3 is preferably a multi-layer printed circuit board. The heart of these plates 2, 3 is the heating conductor 6, the meanders of which are arranged as close as possible around the active printed circuit board surface 1 to be tested, so that the heat, to the greatest possible extent, only has to migrate for a short time (FIG. 3A). To prevent the structure of the heat conductors 6 from being transferred to the printed circuit board being tested, a full-surface copper layer 7 is applied over the heat conductors 6 and acts as a heat distributor (diffuser) (FIG. 3B). The heating power is provided laterally via a normal power supply. It is advantageous that the electrical tester has a personal protection means that cuts off the power supply as soon as its doors are opened. For example, an automatic tester from MicroCraft, Japan, such as the E4H6151L model, may be used.

In a further development of the concept according to the present invention, the following improvements to the heating plates 2, 3 according to the present invention are also proposed:

The stabilizing outer frame plates, particularly designed as printed circuit boards are laminated together with the heating plates. Thus, only two parts still have to be brought together.

In another layer, there is installed a thermocouple in order to measure the temperature and in order to pass this back to the machine.

The alignment points for the product to be tested are applied to another, outermost, structured and gold-plated layer.

Figure 4:
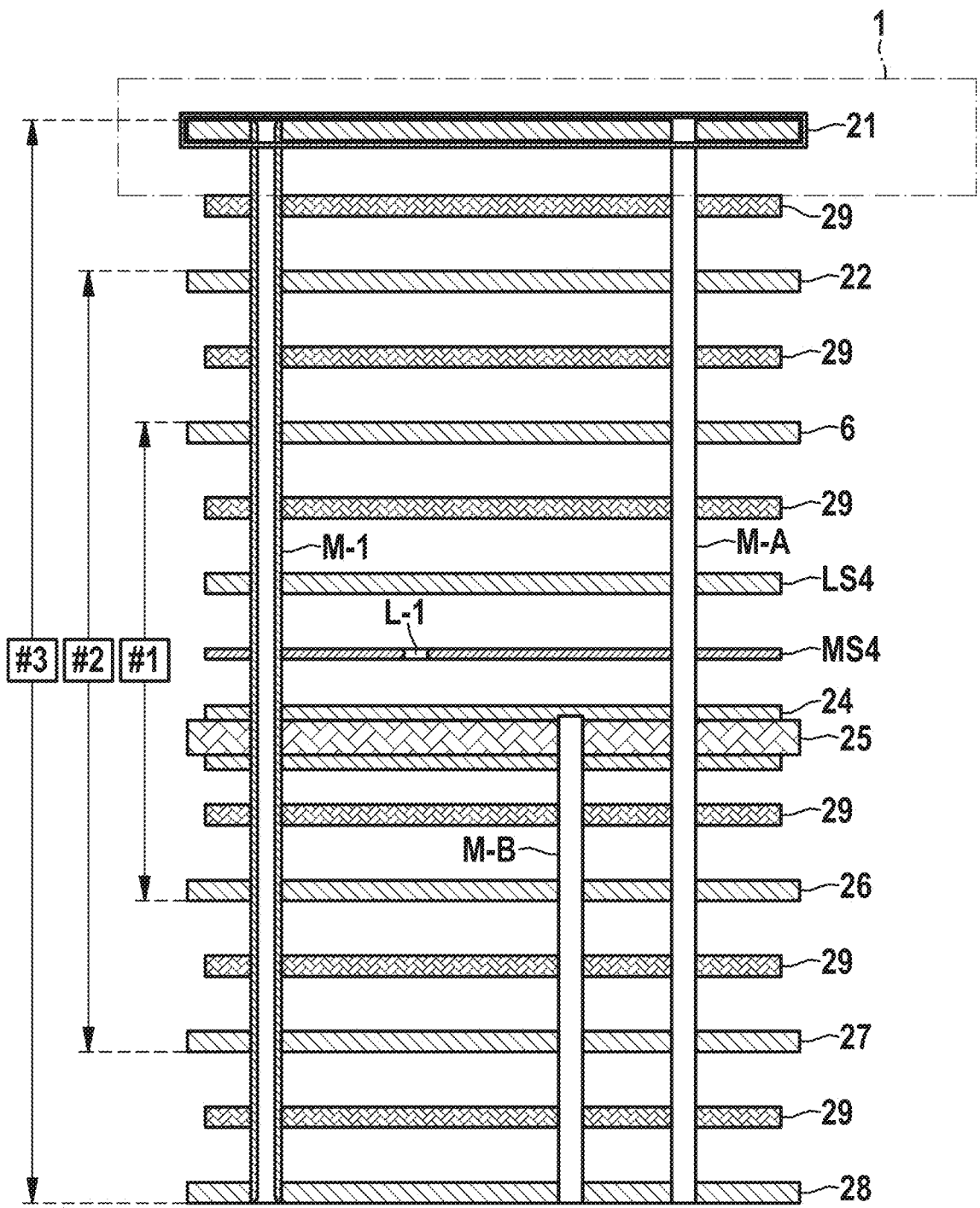
FIG. 4 shows a schematic depiction of a single component (multi-layer heating plate)

A preferred heating plate is shown schematically in FIG. 4 and comprises the following layers: an outer layer with alignment points (copper, gold-plated) 21, a full-surface copper layer (diffuser) 22, a heating meander (copper) 6, a layer of protective lacquer for the thermocouple LS4, wherein a layer 29 of an epoxy-based insulating material is arranged between each of the aforementioned layers, as well as a thermocouple layer (Constantan) MS4, a layer with depth milling conductor (copper) 24, a multi-layer grid structure (copper, for maintaining symmetry and improved adhesion) 25 to 27, between each of which a layer 29 of an epoxy-based insulating material is arranged, and furthermore a contact layer to the machine (copper, gold-plated) 28. The multi-layer heating plate furthermore has a continuous contour milling M-B, which is arranged depending on the unpopulated printed circuit board 1 to be tested, as well as a continuous throughplating M-1. Furthermore, the multi-layer heating plate has a depth milling M-B, which extends from the contacting layer to the machine (copper, gold-plated) 28 through the grid structure 25 to 27 to the layer with depth milling conductor (copper) 24. Finally, the printed circuit board 1 to be tested rests on the insulation layer between the layers 21 and 22, for testing by means of the method and test device according to the present invention.

It will be apparent to those skilled in the art that numerous modifications and variations of the described examples and embodiments are possible in light of the above teachings of the disclosure. The disclosed examples and embodiments are presented for purposes of illustration only. Other alternate embodiments may include some or all of the features disclosed herein. Therefore, it is the intent to cover all such modifications and alternate embodiments as may come within the true scope of this invention, which is to be given the full breadth thereof. Additionally, the disclosure of a range of values is a disclosure of every numerical value within that range, including the end points.

The invention claimed is:

1. A test method for an unpopulated printed circuit board comprising the steps of:
   a) exposing the unpopulated printed circuit board to temperatures of a reflow soldering process in a range of 200° C. to 250° C., and
   b) testing the electrical connections of the unpopulated printed circuit board at a temperature in a range of 100° C. to 120° C.

2. The test method according to claim 1, wherein step a) is carried out by means of a first heating plate and a second heating plate, the unpopulated printed circuit board being arranged between the first heating plate and the second heating plate, with the first heating plate, the unpopulated printed circuit board, and the second heating plate being surrounded by a first frame plate and a second frame plate.

3. The test method according to claim 2, wherein the first heating plate and/or the second heating plate comprise a heating conductor with a meandering shape.

4. The test method according to claim 2, wherein the first heating plate, the second heating plate, the first frame plate and/or the second frame plate has multiple openings.

5. The test method according to claim 1, wherein the testing of the electrical connections comprises:
   measuring resistance and/or capacitance of one or more electrical connections of the unpopulated printed circuit board and comparing the measured resistance and/or capacitance to a reference value; and determining whether the electrical connection of a network test point is electrically connected to another electrical connection of the network test point based on the comparison.

6. A method for producing a populated printed circuit board, comprising the steps of:

providing multiplicity of unpopulated printed circuit boards, testing the multiplicity of unpopulated printed circuit boards using a test method according to claim 1, selecting an unpopulated printed circuit board having intact electrical connections from the multiplicity of tested unpopulated printed circuit boards, populating the selected unpopulated printed circuit board having intact electrical connections with one or more electronic components including a reflow step with the populated printed circuit board.

7. A test device for performing a functional test of an unpopulated printed circuit board, the test device comprising:

a first heating plate and a second heating plate, the first heating plate and the second heating plate being configured to receive an unpopulated printed circuit board, and a first frame plate and a second frame plate, the first frame plate and the second frame plate being configured to receive the first heating plate and the second heating plate;

wherein the first heating plate, the second heating plate, the first frame plate, and/or the second frame plate has multiple openings; and wherein, when an unpopulated printed circuit board is received by the first heating plate and the second heating plate:

upon activation of the first heating plate and the second heating plate, heat is generated and transferred to the unpopulated printed circuit board, thereby exposing the unpopulated printed circuit board to a temperature encompassed by a reflow soldering process; and the multiple openings grant access to one or more electrical connections of the unpopulated printed circuit board, thereby facilitating testing of the electrical connections of the unpopulated printed circuit board.

8. The test device for performing a functional test of an unpopulated printed circuit board according to claim 7, wherein the first heating plate and/or the second heating plate comprise a heating conductor with a meandering shape.

9. The test device for performing a functional test of an unpopulated printed circuit board according to claim 7, wherein the first heating plate and/or the second heating plate have a coating made of copper.

10. The test device for performing a functional test of an unpopulated printed circuit board according to claim 7, wherein the first frame plate and/or the second frame plate is made of a copper-free printed circuit board material.

11. The test device for performing a functional test of an unpopulated printed circuit board according to claim 7, further comprising a magnetic element which is configured to hold the first heating plate and the second heating plate or the first frame plate and the second frame plate together.

12. The test device for performing a functional test of an unpopulated printed circuit board according to claim 7, wherein the first heating plate and the first frame plate and/or the second heating plate and the second frame plate are laminated together.

13. The test device of claim 7, wherein:

the electrical testing comprises measuring resistance and/or capacitance of one or more electrical connections of the unpopulated printed circuit board while the unpopulated printed circuit board is exposed to the temperature encompassed by a reflow soldering process and comparing the measured resistance and/or capacitance to a reference value to determine whether the electrical connection of a network test point is electrically connected to another electrical connection of the network test point.

14. A test method for an unpopulated printed circuit board comprising the steps of:

arranging an unpopulated printed circuit board between a first heating plate and a second heating plate;

a) generating heat by activating the first heating plate and the second heating plate and exposing the unpopulated printed circuit board to a temperature encompassed by a reflow soldering process in the range of 200° C. to 250° C.; and b) while the unpopulated printed circuit board is exposed to a temperature in the range of 100° C. to 120° C.:

measuring resistance and/or capacitance of one or more electrical connections of the unpopulated printed circuit board and comparing the measured resistance and/or capacitance to a reference value; and determining whether the electrical connection of a network test point is electrically connected to another electrical connection of the network test point based on the comparison.

* * * * *